(12) United States Patent
Bell

(10) Patent No.: US 6,229,964 B1
(45) Date of Patent: *May 8, 2001

(54) IMAGE WITH SOUND PLAYBACK APPARATUS

(75) Inventor: Cynthia S. Bell, Webster, NY (US)

(73) Assignee: Eastman Kodak Company, Rochester, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,244

(22) Filed: Feb. 26, 1998

(51) Int. Cl.[7] .............................. G03B 17/24; G06K 7/00; G06K 7/10
(52) U.S. Cl. ..................... 396/310; 396/312; 396/315; 396/321; 235/439; 235/454
(58) Field of Search .................................. 396/310, 311, 396/312, 313, 315, 318, 321; 235/439, 462.03, 462.45, 462.49, 472.03, 472.01, 454

(56) References Cited

U.S. PATENT DOCUMENTS

| | | | |
|---|---|---|---|
| 3,585,367 | * | 6/1971 | Humbarger ........................ 235/454 |
| 3,643,068 | * | 2/1972 | Mohan et al. ................. 235/462.03 |
| 3,743,820 | * | 7/1973 | Willits et al. ........................ 235/439 |
| 3,770,942 | * | 11/1973 | McMurtry ....................... 235/462.49 |
| 4,375,058 | * | 2/1983 | Bouma et al. ....................... 382/181 |
| 4,983,996 | | 1/1991 | Kinoshita ............................. 396/312 |
| 5,128,700 | | 7/1992 | Inoue et al. ......................... 396/312 |
| 5,313,235 | | 5/1994 | Inoue et al. ........................... 40/455 |
| 5,359,698 | * | 10/1994 | Goldberg et al. .................... 704/201 |
| 5,451,178 | * | 9/1995 | Yorozu et al. ....................... 446/175 |
| 5,757,468 | * | 5/1998 | Patton et al. .......................... 355/40 |
| 5,814,803 | * | 9/1998 | Olmstead et al. ............... 235/462.01 |

* cited by examiner

*Primary Examiner*—Eddie C. Lee
(74) *Attorney, Agent, or Firm*—Darby & Darby; Francis H. Boos, Jr.; Roland R. Schindler, II

(57) ABSTRACT

An icon reader reads picture identification data from a data icon on an image print. This data is used to determine the location of a corresponding sound bite contained in a memory module and for playing the sound bite. The memory module contains sound bites recorded at the camera during picture taking. The icon reader includes a data reader module that optically scans the data icon from one location to read the picture identification data. The icon reader further includes a decoder for decoding the encoded picture identification data, and a data port for selective communication with the memory module. In one embodiment, the icon reader is structured to be a self-contained sound playback apparatus in which a sound IC card is docked to the data port and, in another embodiment, the icon reader is coupled with a wireless communication device for communicating the decoded picture identification data to a remote memory archive unit having built-in sound playback apparatus. The archive unit is capable of storing a plurality of sound IC cards or memory modules.

32 Claims, 11 Drawing Sheets

IMAGE WITH SOUND PLAYBACK APPARATUS

FIELD OF THE INVENTION

The invention generally relates to apparatus for playing pre-recorded audio segments associated with a viewed image and, more particularly, to apparatus for associating printed, encoded identification data on an image with a corresponding sound bite for retrieval of that sound bite for playback purposes.

BACKGROUND OF THE INVENTION

Photographs have been and continue to be a popular means for capturing and storing visual images. However, conventional cameras are somewhat limited in terms of the features they offer, especially with the advent of video cameras that allow for simultaneously capturing both visual images and sound recordings. Many people still prefer photographs to moving pictures, but wish to simultaneously record sound bites along with photographs, and to be able to retrieve and play the appropriate sound bite when viewing a particular photograph to therefore enjoy both visual and aural stimulation.

In commonly assigned, co-pending U.S. patent application Ser. No. 08/705,350 to Patton et al., filed Aug. 29, 1996, there is described an arrangement for creating image prints having sound icons printed on or attached to the face of the print. The icon identifies the image to the viewer as one having sound recorded in association with the print and contains a code that provides a pointer that can be associated with an address to a sound memory location for accessing the corresponding sound data file for playback purposes.

U.S. Pat. Nos. 5,128,700 and 5,313,235, both assigned to Minolta Camera Kabushiki Kaisha, describe a system for recording sound bites in a photographic camera in association with taking a picture and forming an image in the form of a longitudinal bar code on the resulting image print. The bar code contains a code identifying a corresponding sound memory card and an address on the card for identifying the memory location at which the corresponding sound data is stored for that particular picture. The use of a tethered wand-type bar code reader is disclosed as the means for reading the bar code on the image print to identify the memory address so that the corresponding sound data may be retrieved and played back. Such an arrangement requires a steady hand to guide the wand accurately across the longitudinal bar code to correctly read the code. Furthermore, because photo finishers typically do not print the edges of negatives, such a system requires that a relatively large and unsightly bar code be placed into the printed image area, thereby detracting from the available area for the image itself.

In addition, U.S. Pat. No. 4,983,996, assigned to Casio, discloses a camera system that captures and records sound bites as well as capturing visual images. The system disclosed teaches that the sound bites captured by the camera are converted into digital data, and then imprinted directly on the negative in the form of a bar code. Thus, this system also requires that the bar code be placed into the printed image area. In addition, in order to play back the sound bite, a steady hand must accurately guide a bar code reader across the bar code on the image.

Thus, it will be apparent that there continues to be a need for an apparatus for reliably and efficiently reading encoded identification data on a printed image in order to accurately retrieve the corresponding sound data from a location in memory. The instant invention addresses these needs and others.

SUMMARY OF THE INVENTION

Briefly, the present invention comprises an icon reader working in concert with an icon formed on an image to accurately and conveniently read the code contained in the icon while the icon reader remains stationary relative to the icon. Thus steady hand motion is not a concern, as there is no need to displace the icon reader relative to the icon in order to read the code contained in the icon. The code comprises picture ID data and is decoded to link the image with a corresponding sound bite contained in a sound data file, which is played back in a sound playback apparatus.

Thus, in one preferred embodiment, the apparatus of the present invention comprises: an optical data reader module having an optical area substantially corresponding with that of the icon for alignment over the icon, the module being operative to optically illuminate and sense encoded data from the icon. In another embodiment, a decoder device is provided and decodes the sensed data which represents picture ID data, and discerns the corresponding sound data file associated with the identified picture.

In yet another preferred embodiment, the present invention includes a data reader in the form of a wand comprising an optical data reader module, a decoder, and a data port to which is connected a sound IC card. Thus the invention provides a self-contained unit, with the data reader module sensing the encoded data, the decoder decoding the sensed data, and the sound IC card providing the corresponding sound bite for playback thereof.

In still another embodiment, the present invention includes a transmission module in place of the sound IC card for remote communication with an archive unit that stores plural sound IC cards or chips.

BRIEF DESCRIPTION OF THE DRAWINGS

These and other aspects, objects, features and advantages of the present invention will be more clearly understood and appreciated from a review of the following detailed description of the preferred embodiments and appended claims, and by reference to the accompanying drawings, wherein:

DETAILED DESCRIPTION OF THE INVENTION

Figure 1A:
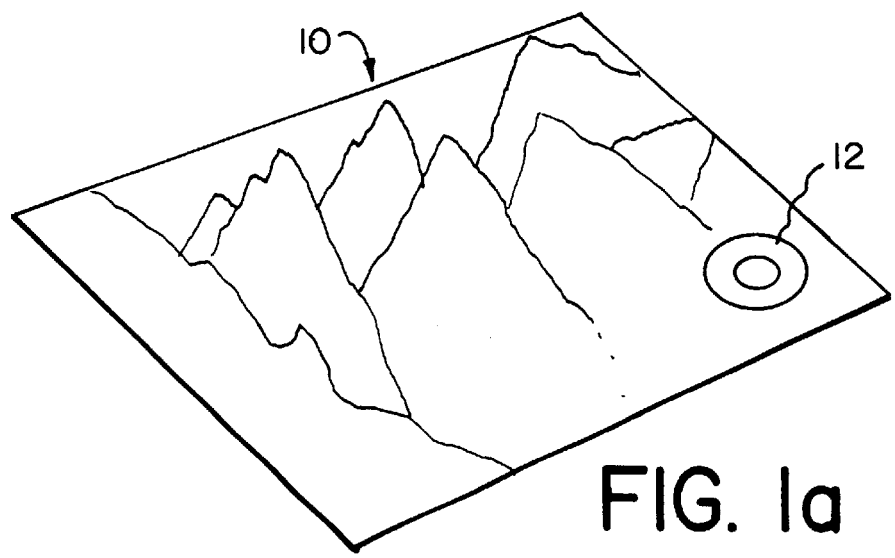
FIGS. 1a and 1b show an image print with a sound icon located on the print, and an icon reader embodying one aspect of the present invention being positioned over the icon for reading the identification data contained in the icon.

In the following detailed description, like reference numerals will be used to refer to like or corresponding elements in the different figures of the drawings. Briefly, the present invention comprises a portable icon reader 14 (FIG. 3) that reads encoded data from an icon 12 attached to an image 10, such as a printed photographic image or other visual image. The icon reader is sized for alignment over the icon and may read the encoded data without the need for any scanning motion or other movement of the icon reader relative to the icon. In one preferred embodiment, the icon reader includes sound playback components and thus defines a self-contained unit.

Figure 1B:
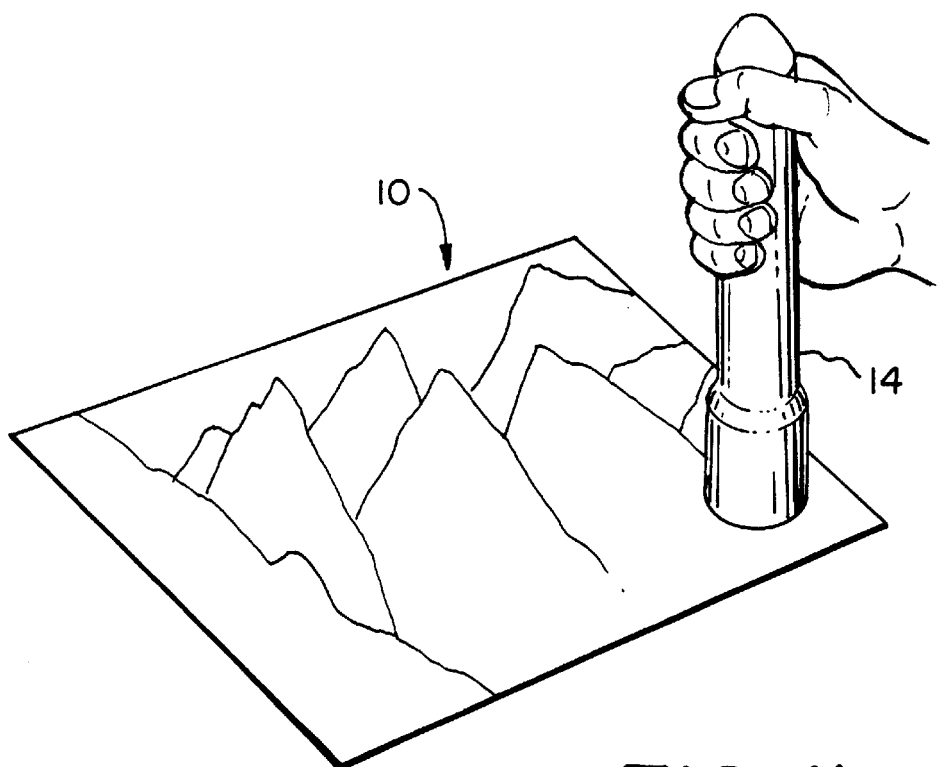

Referring now to FIG. 1a, there is shown a hard copy image print 10 on which a sound data symbol or icon 12 is printed, preferably in one corner of the print so as to only minimally interfere with the image itself. The data-containing symbol or icon contains encoded picture identification (ID) data as described in greater detail below. Apparatus and methods for imprinting such icons on photographic prints are described in the above mentioned U.S. patent application Ser. No. 08/705,350, the contents of which are incorporated herein by reference. FIG. 1b shows the manner in which an icon reader or wand 14 of the present invention, the structure of which is described in greater detail below, is placed over the icon by a person viewing the print for the purpose of retrieving and playing back a sound bite recorded at the time the corresponding image was captured. As an alternative to being directly imprinted on the image print 10, the sound icon 12 may be printed on a separate medium and adhesively affixed to the image, such as in the form of a sticker.

Figure 2A:
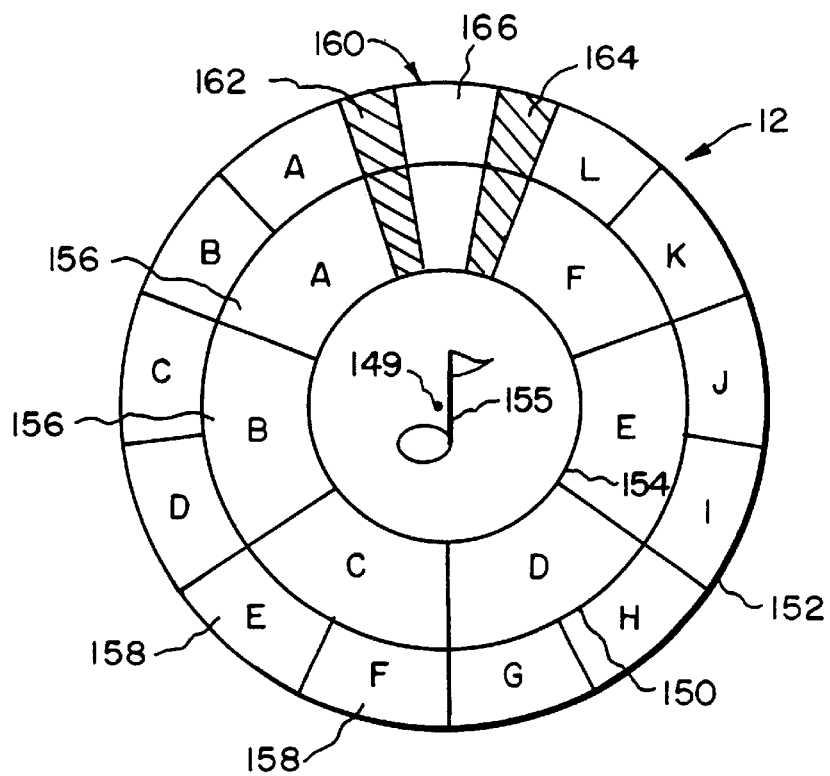
FIGS. 2a and 2b are full and partial schematic illustrations of a sound icon containing encoded picture identification data.

A preferred embodiment of the icon 12 is shown in FIG. 2a. In the preferred embodiment, the icon 12 includes a central circular area 154 formed with a symbol 155 to visually indicate to a viewer that there is an audio segment associated with the particular image, and further comprises two annular areas 150 and 152 encircling the central area and bearing encoded picture ID data which can be used to uniquely identify the corresponding CID and frame numbers for the printed image, or batch and offset numbers for a digital image. The configuration of the icon is such that the encoded data is arranged in a plurality of data segments 156 and 158 circumferentially disposed about a central axis 149. The symbol 155 may be in the form of a musical note that visually signifies to the user that a sound recording accompanies the image print bearing the icon. If sound is captured at the time of picture taking, the symbol is preferably printed automatically during photo finishing, along with the encoded picture ID data in the areas 150 and 152. In the event no sound was recorded by the camera during picture-taking, the center area would be vacant after photo finishing, but could be drawn in manually by the user in the event that sound corresponding with that image was recorded after the image was printed.

Figure 2B:
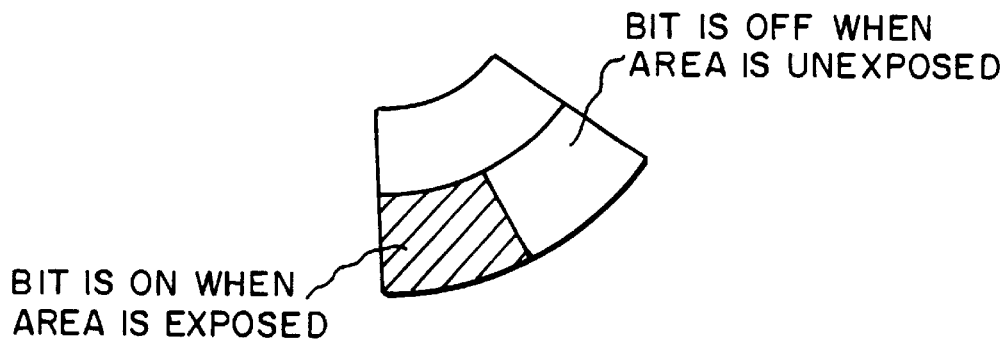

The inner annular ring 150 contains a series of binary encoded segments 156A–F comprising dark and light portions, as shown in FIG. 2b, representing a decimal value used to designate the frame number from a certain roll of film, or a sequence number associated with an offset of the image within a particular batch of captured images. For a digital camera, this may be the image counter number associated with a particular downloaded batch of image files or with a particular storage device. While the ring 150 is shown as having six such segments A–F, it will be apparent to those of ordinary skill in the art that more or less segments may be provided as required. The outermost ring 152 contains the film roll cartridge identification number (CID number) or other image batch identification number designated in binary encoded segments 158A–L. Similarly, ring 152 may be formed with more or less segments as required. This pair of picture identification numbers from icon rings 150 and 152, whether based on photographic print technology or digital print technology, uniquely identifies the image print on which the icon is imprinted and is used to associate the image print with a sound data file stored in a separate memory as is described below. It will be apparent that the inner ring 150 could alternatively be used to designate the CID or image batch number, while the outer ring 152 could be used to designate the frame or sequence number for the particular cartridge or batch.

Both of the rings 150 and 152 also preferably contain an alignment pattern 160 comprising alternating dark and light radial segments 162, 164 and 166 in which half segments 162 and 164 are dark and are separated by a full width, light segment 166. The alignment pattern is used to determine the orientation of the icon reader 14 relative to the icon 12, as is described in greater detail below. The binary weighted value of any given segment in the inner and outer rings is determined by the clockwise (or counterclockwise) angular distance of that segment from the alignment pattern. Thus, in a system that reads the icon in a clockwise direction, after the icon reader has become oriented by determining the position of the alignment pattern, the segment "F" on frame ring 150 represents the $2^0$ value, segment "E" represents the $2^1$ value, and so on. Likewise, the segment "L" on the CID number ring 152 represents the $2^0$ value, segment "K" represents the $2^1$ value, and so on. Thus, it will be apparent that by sequentially reading the icon in either a clockwise or counterclockwise direction and by determining which bits are "on" (for example, all the dark segments), the icon reader may determine both a CID number and frame number for the image to associate the printed image with a sound bite stored at a location in memory.

Figure 3:
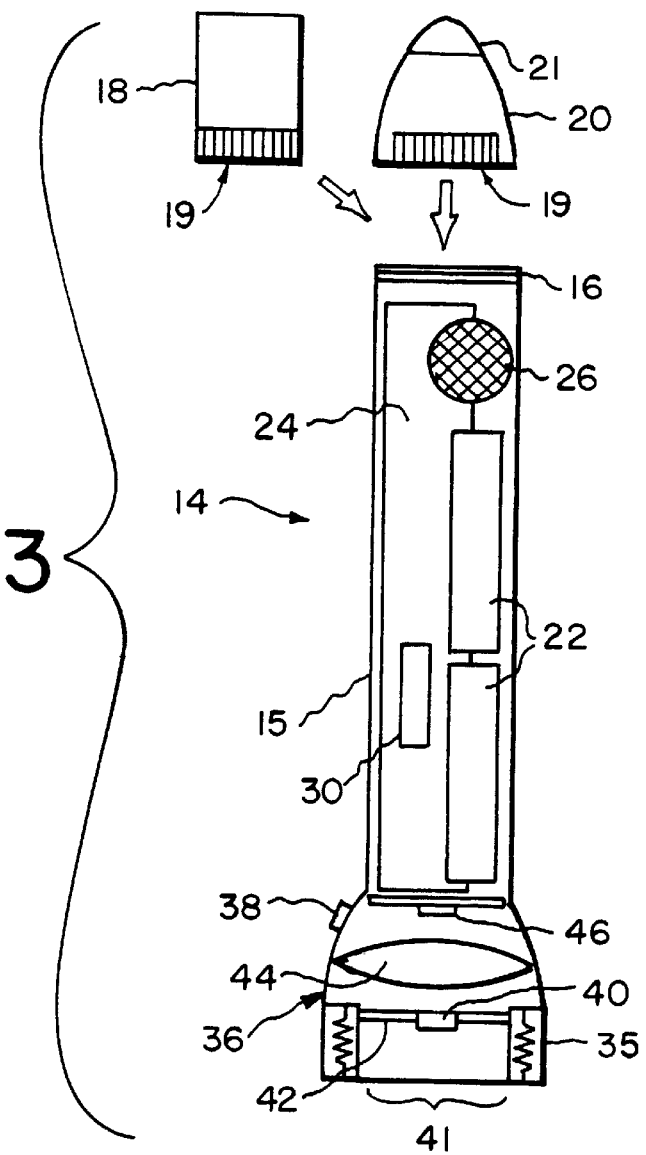
FIG. 3 is a side view of the icon reader of the present invention.
Figure 4:
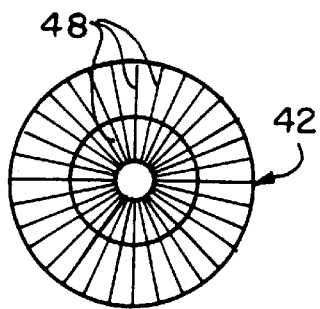
FIG. 4 is a schematic illustration of an LCD mask comprising one component of a data reader module of the icon reader of FIG. 3.
Figure 5:
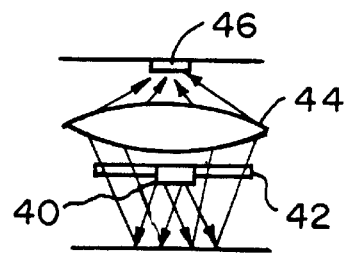
FIG. 5 is a schematic illustration of the data reader module incorporated in the icon reader of FIG. 3.

Referring now to FIGS. 3–5, the icon reader 14 of the present invention will be described. The icon reader is preferably in the form of a portable wand or hand-held unit and comprises an elongated housing 15, one end of which is provided with a data port 16 including a plurality of internally housed data terminals (not shown) for selective connection with a sound IC card 18 and a wireless communication module 20, each of which is formed with corresponding terminals 19 for selective engagement with the terminals of the data port to establish electrical communication therebetween. The module 20 preferably includes a transmitter 21 such as an IR or RF transmitter for wireless communication with a remote playback station as described in greater detail below. While a wireless communication module is preferred, it will be understood that a cable may be used to couple the data port with the remote archive and playback station to establish communication therebetween.

The other end of the icon reader 14 is provided with a data reader module 36 configured for stationary positioning by the user over the icon 12 on the printed image 10 and for actuation of the electronics incorporated therein so as to read the encoded picture ID data contained in the icon. Within the housing 15, there is provided an integrated circuit board 24, power supply batteries 22, and, in a preferred embodiment, a speaker/microphone enclosure 26.

The data reader module 36, as is described in greater detail below, is preferably formed having dimensions identical with or slightly larger than those of the icon 12. Accordingly, the icon reader may read the entire icon without the need for any awkward swiping or scanning motion of the icon reader across the icon. The module must simply be placed over the icon. The module self-aligns rotationally as is described in greater detail above.

The sound IC card 18, of well known design, includes a standard digital memory unit (not shown) and is controlled by a controller 28 on circuit board 24 to access and retrieve a particular sound bite data file stored in the memory unit at a location indicated by an entry in an association table (FIG. 14) based upon the picture ID data read from the icon for playback directly by the icon reader 14. Thus, in one preferred embodiment, the icon reader 14 defines a self-contained unit. By including the sound IC card 18, controller 28, and speaker 31, the icon reader unit is capable of reading picture ID data from the icon, locating the corresponding audio segment by referring to the association table, and playing that segment for the viewer. Thus, in this embodiment the icon reader comprises a portable device that does not require a remote playback station or the like, and thus is freely portable in that it is not tied to such a station. And as was described above, the wand operates without any requisite motion of the wand or print.

Alternatively, the communication module 20 is used to transmit decoded picture ID data from a scanned icon to a remote sound archive and playback unit, described below, in which one or more digital memory modules as well as sound playback electronics are located for archiving and playing back the particular sound bite.

Thus, in another preferred embodiment, the user archives the data contained in a sound IC card 18 within an archive/playback unit 200. Then, by configuring the wand with the controller 28, transmitter 20, and icon reader module 36, the wand unit is capable of reading picture ID data from an icon, transmitting the data to the archive/playback unit, where such decoded data is used in conjunction with the association table to locate and retrieve the corresponding audio segment data, with the playback unit playing the audio through its speakers.

Figure 14:
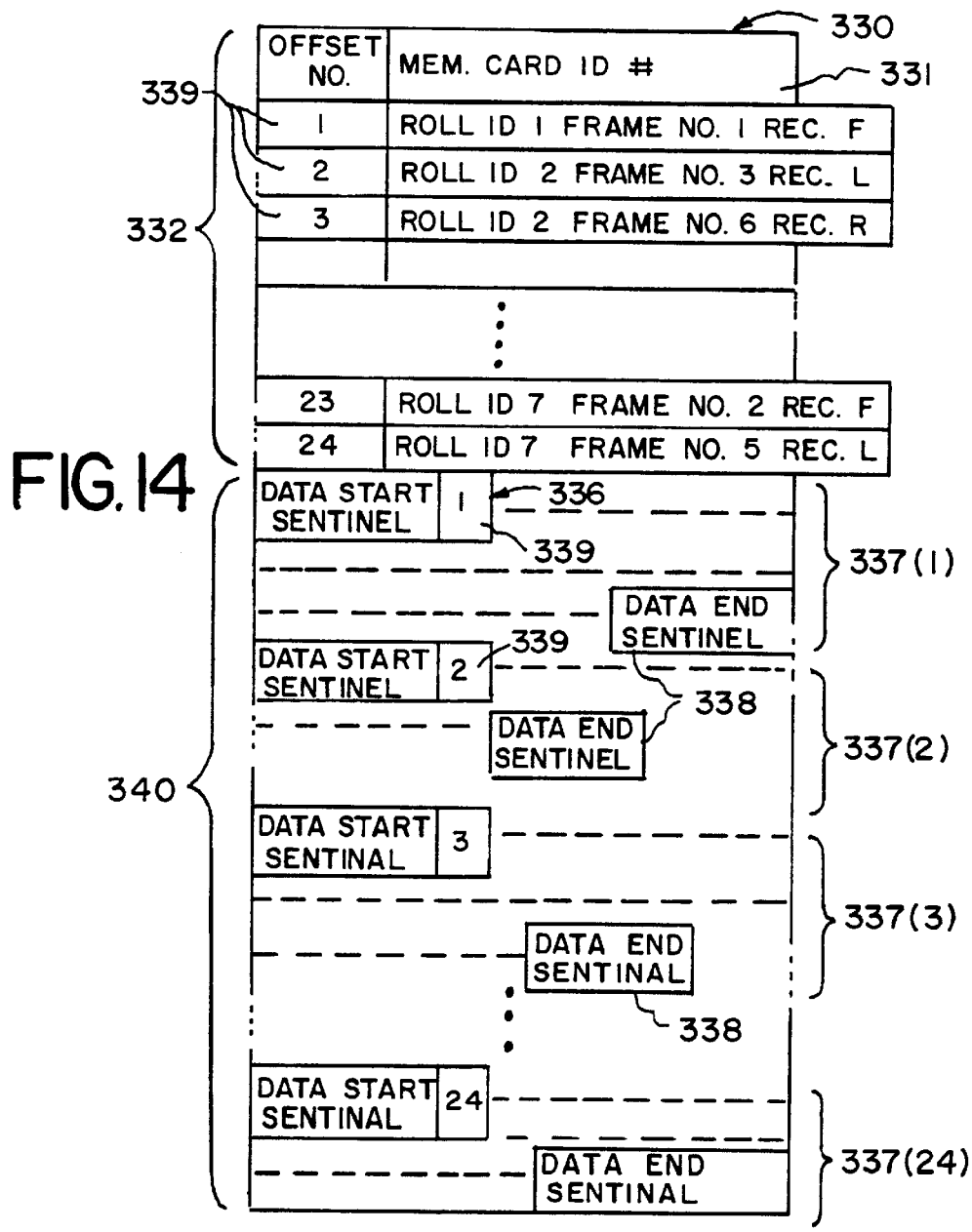
FIG. 14 illustrates a file storage architecture including an association table which links picture identification data to sound bite file addresses.

FIG. 14 shows a file storage architecture 330 comprising an association table section 332 and a sound data storage section 340 set up previously by the user's camera (not shown), when storing picture ID data and sound data in the memory device on the sound IC card 18. This same association table may be transferred later to the mass memory medium 280 installed in the remote playback/archive unit 200.

The association table 332 comprises a field 331, in which the unique memory card ID number is recorded, and a sequential series of address lines 334, each of which provides a segment for recording data to link an image and its sound bite. The images are linked with the corresponding sound bite data files by means of an offset address designator 339 which points to a predefined start site in the remainder of the memory where the corresponding sound bite data is stored. Thus, it will be apparent that the association table allows the micro controller 28 to use the encoded data read from the icon that represents the picture ID data for a particular image to determine the location in memory where the corresponding audio segment is stored. The micro controller simply accesses the association table and searches for the matching picture ID and, once found, determines the offset location for the desired audio segment.

The address data in address lines 334 may include information specifying which image the sound bite at the offset address corresponds with, such as the image set ID number (e.g., film cartridge ID or digital image download batch number) and frame number (or digital image sequence number). It may be desirable to record sound from multiple directions around the picture-taking scene, so more than one sound record may be linked with a particular image. This information becomes valuable when the user is viewing his or her image on a soft display. For example, as the user navigates toward the left end of the image, the sounds recorded from the left side of the image could be given more emphasis in the audio blend, thereby adding realism to the image navigation. Thus, the header for each audio recording may also include recording ID and capture information that assists in reconstructing the sound record in proper spatial alignment with the image, such as the orientation of the microphone from which the recording was made. See, for example, U.S. patent application Ser. No. 09/030,984, filed concurrently herewith, the disclosure of which is incorporated herein by reference.

The sound data storage section 340 comprises a series of fixed size memory blocks 337. Within each block, a variable sized bite of sound information is stored and is bounded by start and end data sentinels 336, 338. The start sentinel 336 is always at the beginning of the memory block while the end sentinel follows the end of sound data segment and is therefore variably located depending upon the length of the recorded sound bite. This allows random access to any sound bite without the requirement for serially searching to locate the appropriate start sentinel. Also, re-recording sound bites of a duration shorter or longer than the original recording duration is made possible up to the maximum size of the memory block 337, without any fear of overwriting over another image's sound bite.

Referring to FIG. 3, a pressure sensitive switch 35 is positioned at the lower end of the data reader module 36 to actuate the icon reader 14 when it is pressed down lightly on a surface. A user interface switch 38 is provided on the exterior of the housing 15 to allow the user to select an alternate operating mode such as battery check or sound recording in association with the icons sensed by the reader 36. In the preferred embodiment of the invention, the default mode of operation is for the playback of sound, either by the icon reader itself or by the remote playback station.

The icon reader 14 is preferably provided with a microphone housed in the enclosure 26 for recording sound bites, with the sound bites being stored in either the sound IC card 18 attached to the data port 16 or in the memory of the remote playback station via the communications module 20. In either case, the sound bite is stored in a memory location linked to the picture ID data read from the icon 12 on the printed image 10 through the association table. Thus, each printed image preferably includes an icon with unique picture ID data, regardless of whether a sound bite is recorded at the time the image is taken, thereby allowing for sound bites to be subsequently recorded and stored in memory with a unique address for future retrieval and play back.

The data reader module 36 is preferably provided with a small illumination source 40 (FIGS. 3 and 5), such as a photo-emitter or a seed lamp powered by the batteries 22, a reader area 41 comprising a segmented LCD mask 42, a collector lens 44, and a light sensor 46, such as a photodiode. The reader area 41 is shaped to conform with the configuration of icon 12 and is responsive to sensing the exposed and unexposed areas on the icon for reading out the encoded data represented by the data segments in areas 150 and 152. In the illustrated embodiment, the LCD mask 42, seen best in FIG. 4, is annular in shape to conform with the annular areas 150 and 152 of the icon 12 and has a finely structured segmented pattern 48 that facilitates alignment of the data reader module 36 with the icon segments during icon reading operations. Pattern 48 is structured with the same annular ring arrangement as described for the icon 12 but the radial segments of the pattern 48 are more finely divided as described in greater detail below. The illumination source 40 is positioned in alignment with the center of the segmented LCD mask on the side of the mask nearest the printed icon and opposite the light sensor 46. This enables the reader to pass illumination without losses due to LCD polarizers. The segments of the LCD mask are normally opaque to prevent the passage of light, and are selectively enabled so as to be light transmissive. Thus, the segments of the LCD mask are sequentially enabled by the controller 28 in a clockwise (or counterclockwise) direction while the illumination source illuminates the icon, and the readings are taken from the light sensor to read the encoded picture ID data from the icon.

Figure 6:
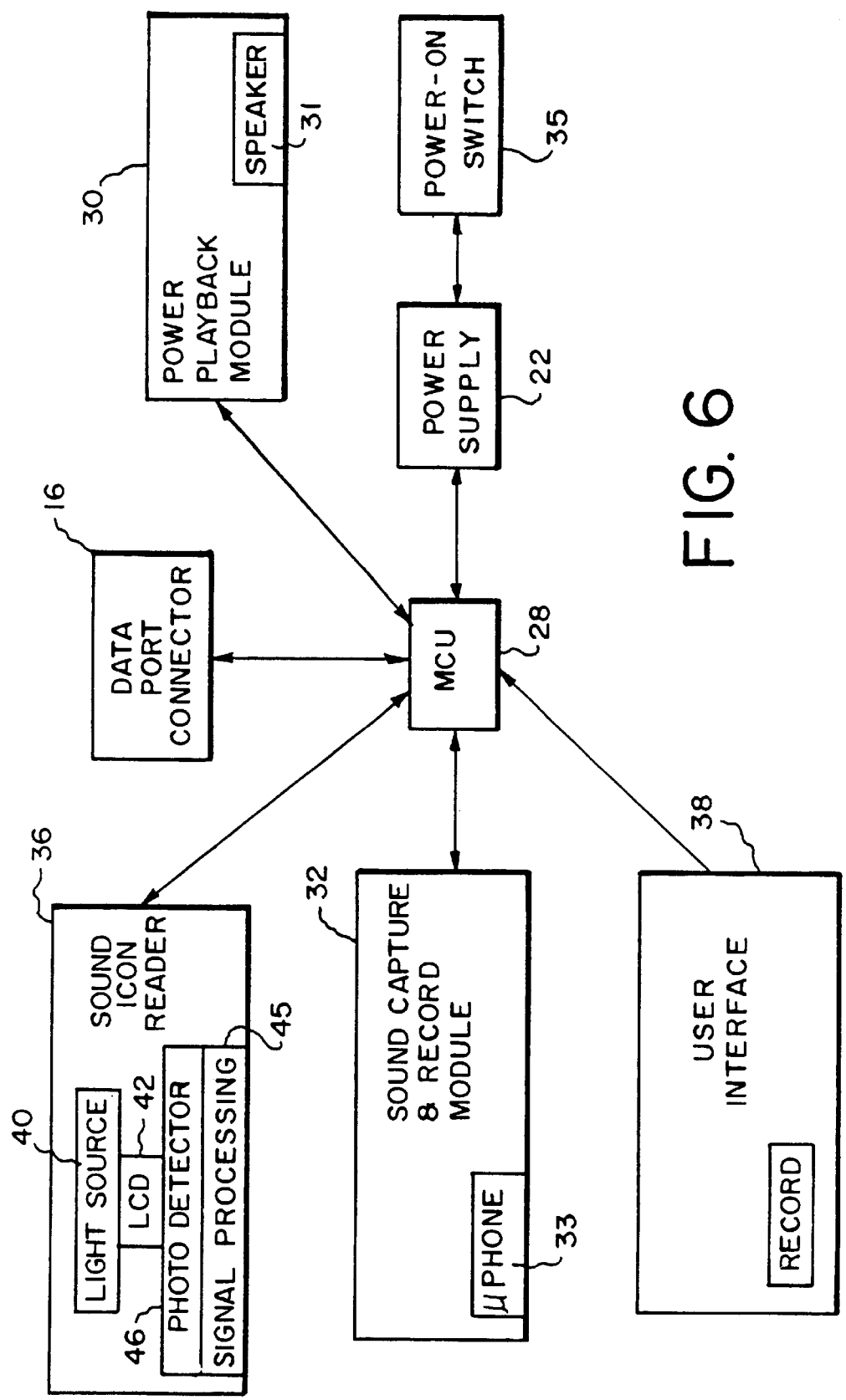
FIG. 6 is a block diagram of the electronic components of the icon reader of FIG. 3.

FIG. 6 shows in block form the electronic components of the icon reader 14, the majority of which are mounted on the printed circuit board 24. The components include a micro controller/sequencer unit 28 ("MCU" or "controller") which operates to hold the icon reader in a powered up state once the pressure sensitive switch 35 is closed. It also activates the illumination source 40 and proceeds through an alignment routine to orient the icon reader with respect to the icon 12 and enable reading the picture ID data. It will be apparent that once the ID data has been read, the icon reader may be removed from the print while the data is decoded, the association table is accessed, and the corresponding sound bite is retrieved and played back, thereby enhancing viewing of the print while simultaneously listening to the associated sound bite. This has the advantage that the user is not required to hold the icon reader steady throughout the playback operation. The micro controller/sequencer further includes RAM memory (not shown) to store readings taken from the icon as more fully described below. Also included on the printed circuit board are (a) the sound playback module 30, which includes the speaker 31, and (b) a sound capture and record module 32 which includes a microphone 33. The speaker and microphone are preferably mounted in the enclosure 26. The pressure-sensitive switch 35 which is mounted on the reader module, enables the battery power supply 22 to activate the micro controller/sequencer unit 28. The data reader module 36 interfaces with the micro controller/sequencer unit 28 to sense the encoded picture ID data, with the micro controller serving as a decoder for decoding the picture ID data and accessing the association table, thus enabling playback of pre-recorded sound bites or selection of a vacant memory location for storage of sound recorded by the user through the icon reader. The data reader module 36 further includes a signal processor 45 for amplifying the received data signals. The amplified signals are interpreted by the micro controller 28 to determine whether the signal corresponds with an "on" or "off" segment of the icon 12, as described in greater detail below.

Figure 7:
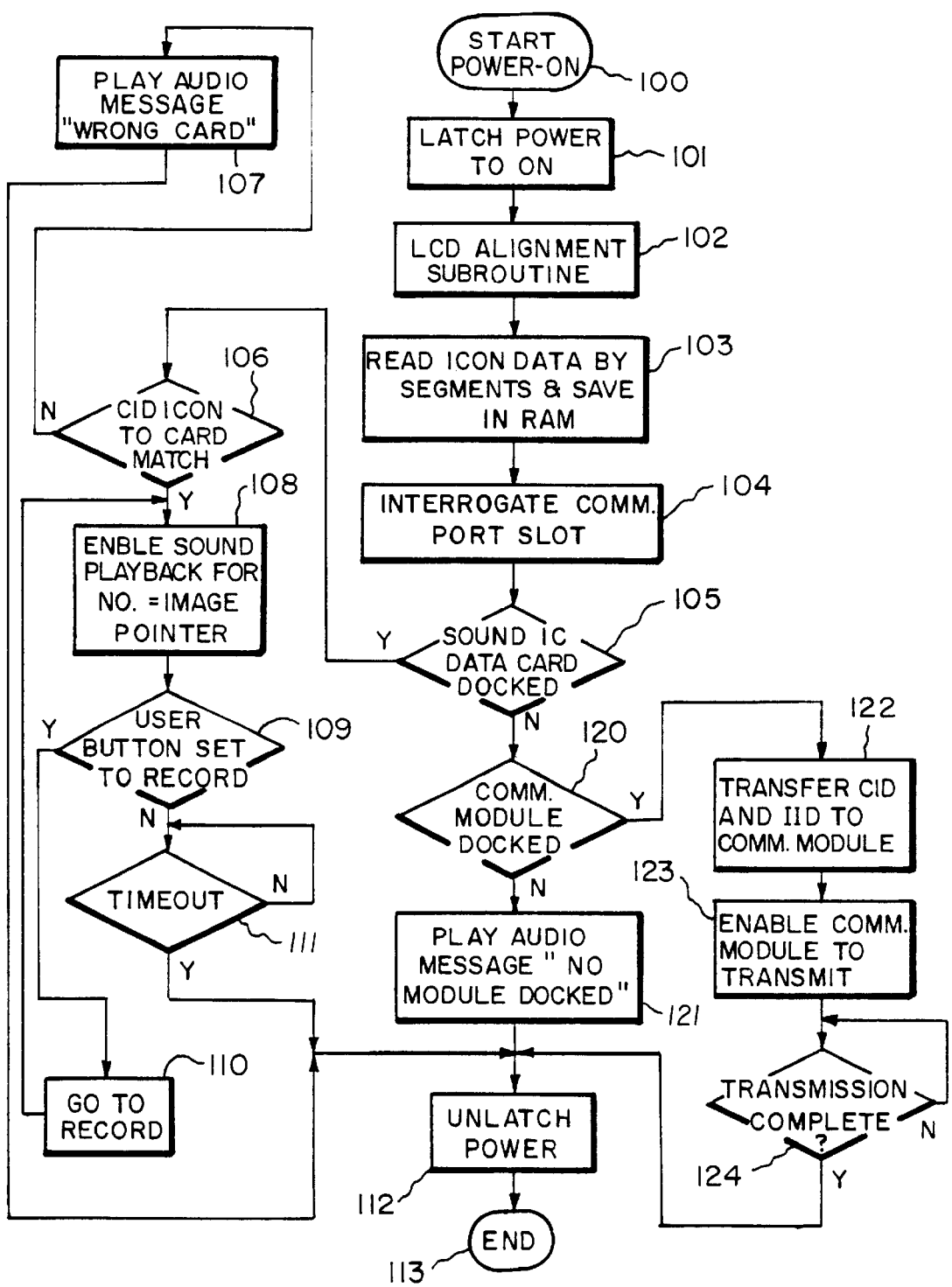
FIG. 7 is a flow chart diagram illustrating the operational flow of the icon reader of FIG. 3.

Operation of the icon reader 14 is best understood with reference to the operational flow diagram of FIG. 7. The operation is started at 100 by positioning the icon reader 14 over icon 12 and pressing down slightly on the image to close the switch 35. This activates the micro controller/sequencer unit 28 which, at 101, latches the power to the ON state during subsequent operations. Next, at 102, an alignment subroutine is initiated. In the alignment subroutine, the segments of the LCD mask 42 are initially all in the blocking state to prevent light from passing therethrough. Adjacent groups of segments are sequentially enabled by the micro controller/sequencer unit 28 to be transmissive to search for the alignment pattern 160 (FIG. 2a). The alignment will be recognized by the combination of OFF and ON segments 162, 164, and 166 as described above. Once the rotational alignment is optimized by means of maximizing the contrast from the alignment pattern elements, the reflected signal levels from the high and low reflectivity areas of the alignment marks are retained in RAM accessible by the micro controller 28. These detected signal levels are used to calibrate the interpretation of the subsequent icon segment readings by the micro controller 28.

After the alignment subroutine has been performed, the micro controller 28 determines which groups of segments in the LCD mask 42 correspond with the individual segments on the icon rings 150 and 152. Because the edge of one of the LCD mask segments may not precisely align with the edge of a ring segment, the LCD mask segments are made very narrow so that at least one and preferably a plurality of the LCD mask segments will be aligned over each icon segment. Thus, in order to read a particular ring segment, that group of LCD mask segments 48 aligned above the icon segment, as determined by the micro controller, are switched to their transmissive states. Only the LCD segments above one icon element are transmissive during each photocell reading. The illumination source 40 is enabled and its light reflects off the icon segment below, through the enabled LCD segments and collecting lens 44 to the photodiode light sensor 46, as shown in FIG. 5. The detected signal is then amplified by the signal processor and then compared to the stored values for the known reflectance portions of the alignment target by the micro controller 28. If the detected signal is closer to the reading from the high reflectance portion of the alignment target, then the icon segment is interpreted as being "ON" or a digital 1; when closer to the low reflectance portion of the alignment target, the icon segment is interpreted as being "OFF" or a digital "0". By doing this, a significant amount of position error can be calibrated out in addition to variation in the battery supply which affects the illumination source strength. Each segment reading is stored in the micro controller/sequencer RAM for subsequent concatenation into the full picture ID number by the micro controller/sequencer once all icon segments have been read.

At function block 103, reading of the encoded rings 152 and 154 proceeds in a straightforward fashion. The micro controller/sequencer unit 28 preferably proceeds clockwise around the mask 42 to read each segment in the icon outer ring 152 and each segment in the inner ring 150. The icon reading procedure is preferably performed by first reading all the segments of the frame number ring 150 and then reading the segments of the CID number ring 152, or vice versa.

The micro controller/sequencer 28 also interrogates the data port 16 of the icon reader 14 at step 104 to determine which type of module is attached at the data port. If query 105 determines that a sound IC card module 18 is attached, then the micro controller/sequencer checks the CID (cartridge ID) number read and decoded from the icon 12 at step 106 to confirm that the correct sound IC card is docked. If it is not the correct sound IC card, a stored message is played at 107 through the speaker 31 notifying the user of this error. If it is the correct sound IC card, then, at step 108, the micro controller enables the playback of the sound recording identified by the frame/image number used as an index or pointer into the association table. The sound data from the IC card 18 is retrieved and converted to an audio signal in the sound playback module 30 and played out by the speaker 31. Step 109 determines if the user has set the button 38 to record and, if so, the recording function is enabled at step 110 and the sound bite is recorded in the sound IC card, after which the recording is played back at step 108. If the recording button is not detected, then, after a timeout period 111, the power is unlatched by step 112.

If query 105 determines that there is no sound IC card docked in the data port connector 16, query 120 determines if the remote communication module 20 is present. If not, then at step 121, an audio message indicating no module is attached is played through the speaker 31 after which the power is unlatched at step 112. After unlatching power, the program ends at step 113. If the remote communication module is sensed, step 122 causes the picture ID number to be transferred to the communication module for communication at step 123 to a remote memory archive and player unit described below. When transmission is complete, as determined at step 124, power is unlatched at step 112.

Figure 8:
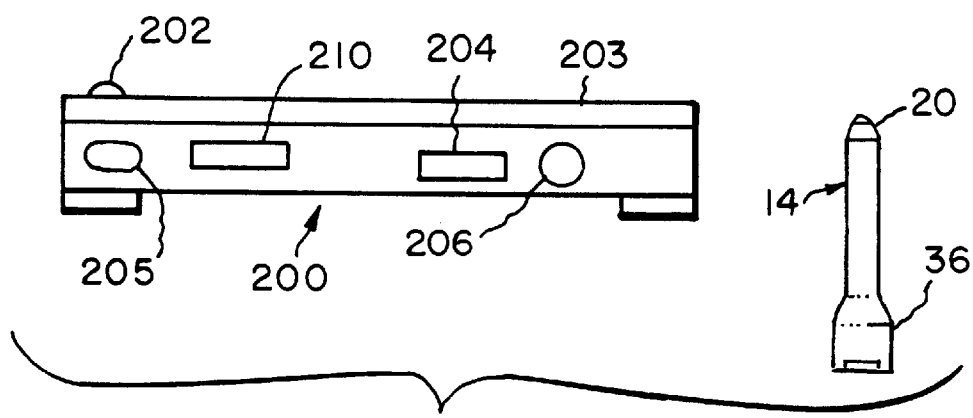
FIG. 8 is a schematic illustration of a sound playback system in communication with the icon reader of FIG. 3 which is used to access sound data stored in a separate playback unit.

The docking of the sound IC card 18 directly onto the data port 16 of the icon reader 14 enhances the convenience of playing back sound while viewing a sound image print in that complete portability is afforded. However, it is desirable to also provide archiving with automated sound retrieval for use after the portable or sharing period has passed. It is expected that as the library of sound image prints grows, there would be a need for archive storage of multiple sound IC cards or, in the alternative, that batches of sound bites associated with multiple film rolls or batches of digital image prints would need to be stored in an archive unit. An example of such a unit is shown in FIG. 8. In this arrangement, a sound archive unit 200 is provided with a cradle 202 on the top 203 for storage of the icon reader 14 when not in use. In this embodiment, the icon reader is preferably provided with the remote communication module 20 that may be either detachable, as described above, or integrally formed on the icon reader.

Figure 9:
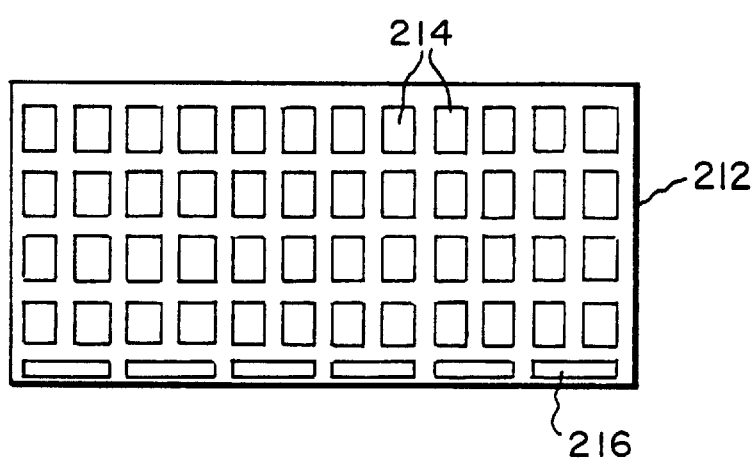
FIG. 9 is a plan view of a sound chip archive board incorporated in one embodiment of the playback system of FIG. 8.

The archive unit 200 includes a remote communication receiver module 205 adapted to receive the picture ID data transmitted by the module 20 (FIG. 8), or may be formed with a data port (not shown) for engagement with a cable connected to the data port 16 for receiving the picture ID data. The archive unit 200 also includes a speaker 206 and external speaker jacks 207 along with appropriate playback electronics 222 for the playback of sound bites. A text display 210 indicates mode of operation and preferably provides identification of the picture ID data communicated by the wand. To provide for archive storage of multiple sound IC cards, the top 203 may be hinged to allow access to a sound memory chip storage board 212, shown in FIGS. 9 and 10, which may include multiple sound memory chips 214 connected via an internal bus to a micro-controller 220 (FIG. 10) in the archive unit. The board may also include expansion slots 216 for temporary or long term connected storage and use of sound IC cards 18 of the type described above.

Figure 10:
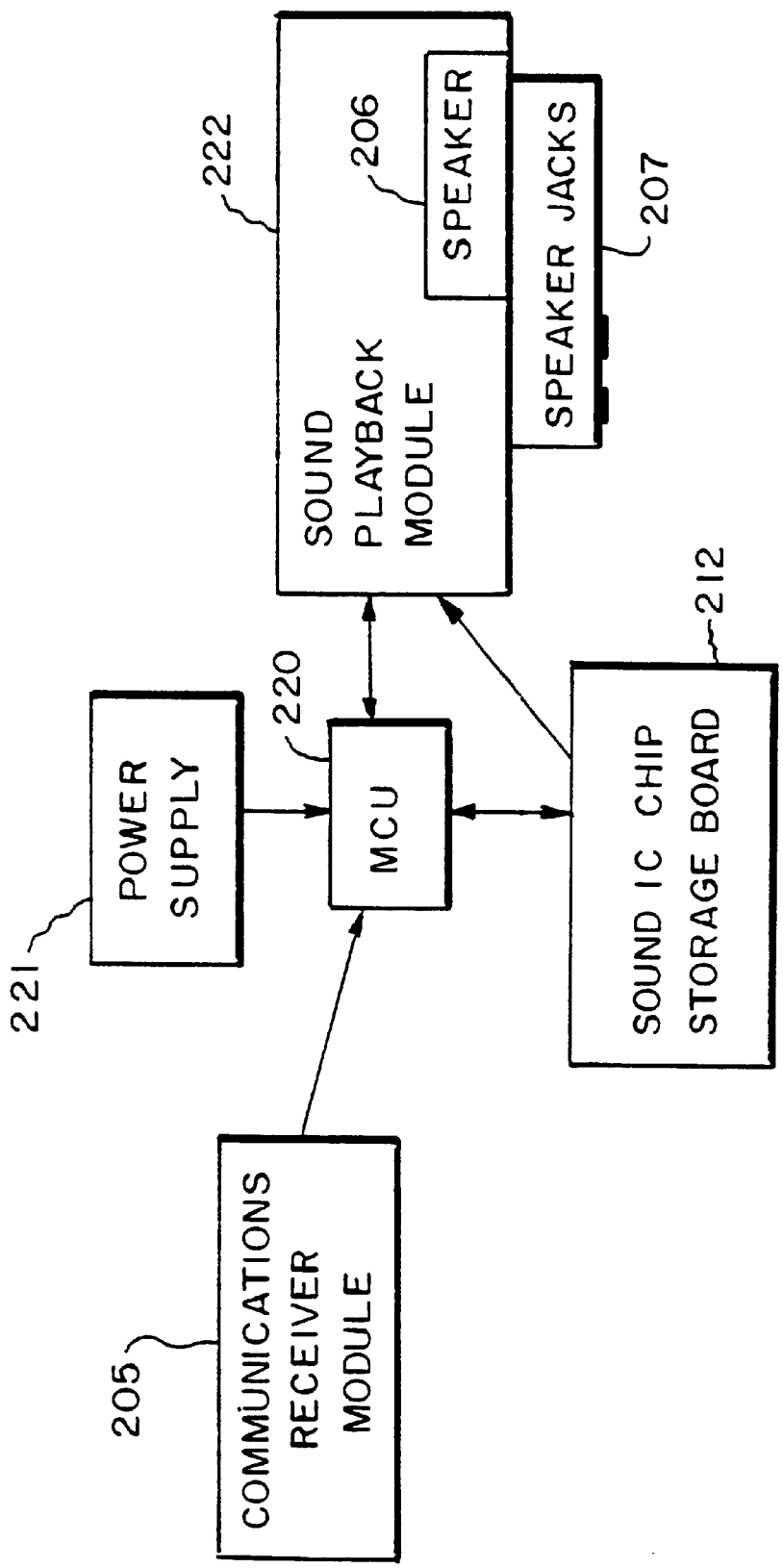
FIG. 10 is a block diagram of the electronic components included in one embodiment of the sound playback apparatus of FIG. 8.

The functional components of the archive unit 200 are shown in FIG. 10 and are similar to the components of the icon reader 14. The archive unit includes a power supply 221, the micro controller unit 220 to control the overall operation of the unit, the remote communications receiver module 205, the sound playback module 222 including an internal speaker 206 and optional speaker jacks 207, and the sound IC chip storage board 212 which holds the digital memory chips 214. The storage board 212 may include chip sockets for mounting individual memory chips 214, a disk reader for insertion of sound data storage disks, or the expansion slots 216 for insertion of insertable memory cards as described above. Thus, it will be apparent that the archive unit stores multiple sets of audio segments, and does not require that a viewer search for and retrieve a corresponding memory IC or floppy disk each time a different image is being viewed and the viewer wants to hear the associated audio. Thus, the archive unit, in connection with the icon reader, provides a convenient playback system.

An advantage of the archive unit 200 is that it provides convenient long term storage of multiple sound memory devices, such that the user need not retrieve and dock a particular sound card 18 to the icon reader 14 for sound access and playback. Also, the archive unit can be connected to higher capability stereo speakers via the speaker jacks 207, thus giving better quality audio reproduction than is possible through a small speaker.

Figure 11:
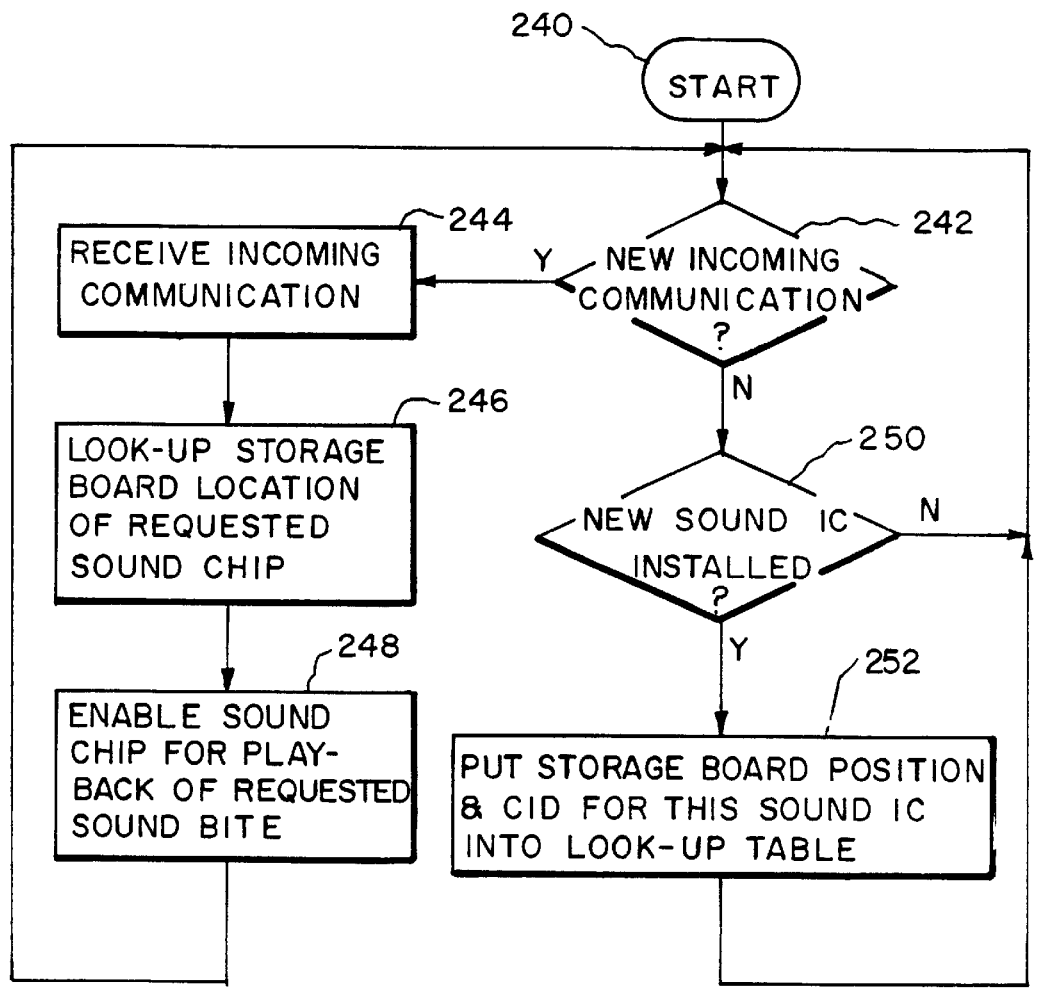
FIG. 11 is a flow chart diagram depicting the operational flow of the playback apparatus embodiment of FIG. 10.

Operation of the archive unit will be described in connection with the functional flow diagram of FIG. 11. When the program is started at 240, micro controller 220 responds to a determination at query 242 that a transmission from the icon reader 14 has been received to enter step sequence 244, 246, 248 to enable the playback of the sound recording identified by the transmitted picture ID data. In this sequence, the received information is used in step 246 by the micro-controller unit 220 to determine the storage position of the desired memory chip from a look-up table (not shown), then to determine the corresponding sound bite using the sound IC association table (FIG. 14) stored in memory and, in step 248, to retrieve the data from the designated chip to enable playback of the requested sound information via the playback module 222. If no transmitted communication is detected but query 250 determines that a new sound IC chip or card has been installed on the storage board 212, the micro controller 220 causes, at step 252, the storage position and CID for this new sound memory data file set to be entered into the lookup table in the archive memory.

Figure 12:
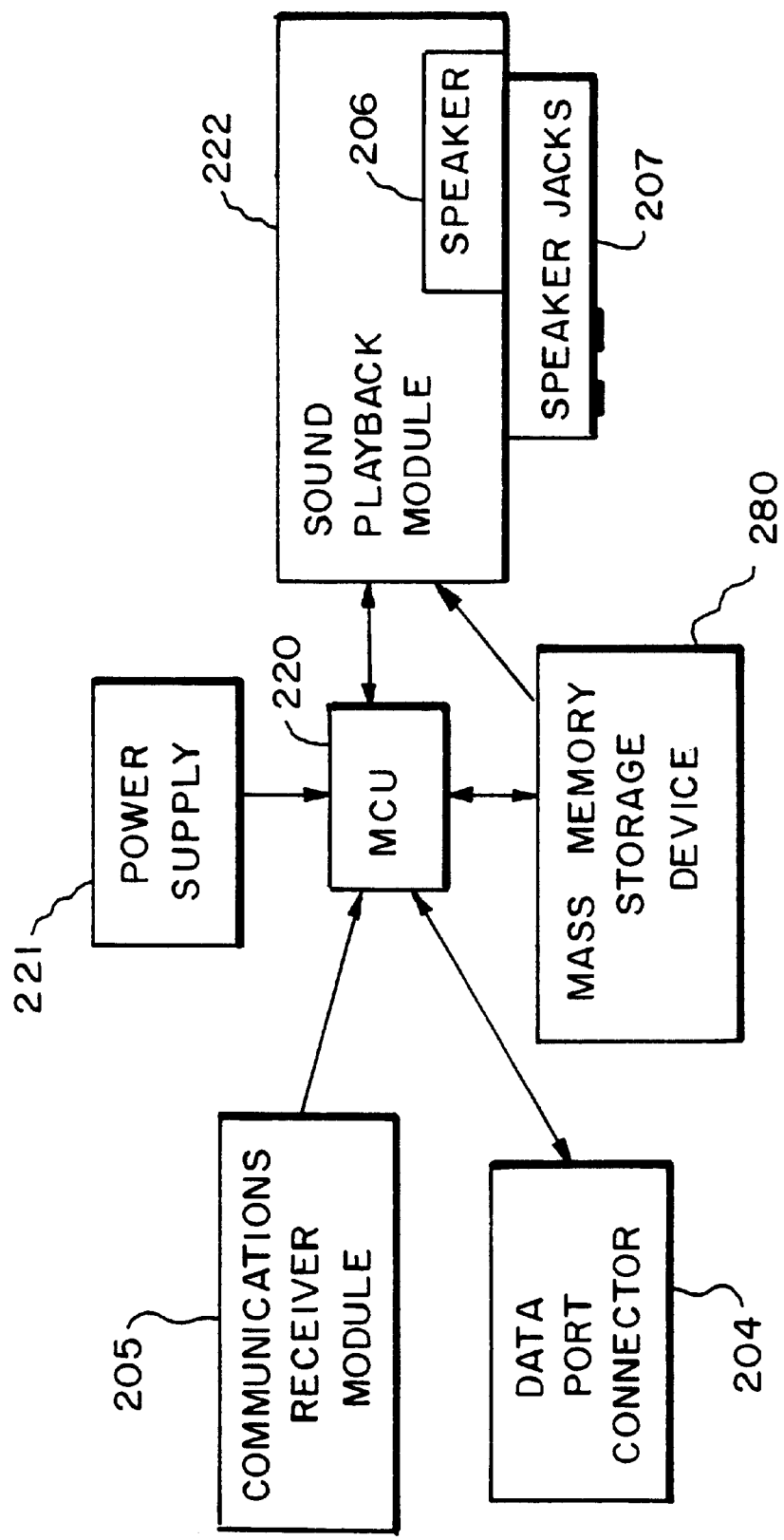
FIG. 12 is a block diagram of the electronic components included in a second embodiment of the playback apparatus of FIG. 8.

Referring to FIG. 12, a block diagram for an alternative embodiment of the archive unit 200 of FIG. 6 is shown. In this alternative embodiment, a mass memory storage device 280, such as a magnetic hard disk or an optical WORM drive, is provided in place of the storage board 212 incorporated in the FIG. 10 embodiment. In this embodiment, an additional data input device 204 is provided on the remote archive unit 200. This device may comprise a card reader or a data port similar to the data port 16 on icon reader 14, and is used for transferring data from a sound memory chip or card to the mass memory storage device 280 within the archive unit. Inclusion of the data input device 204 adds the advantage that sound memory chips can be re-used in the camera after sound data is stored in the archive unit. Other units in the FIG. 12 embodiment corresponding to similar units in the FIG. 10 embodiment carry corresponding reference numerals.

Figure 13:
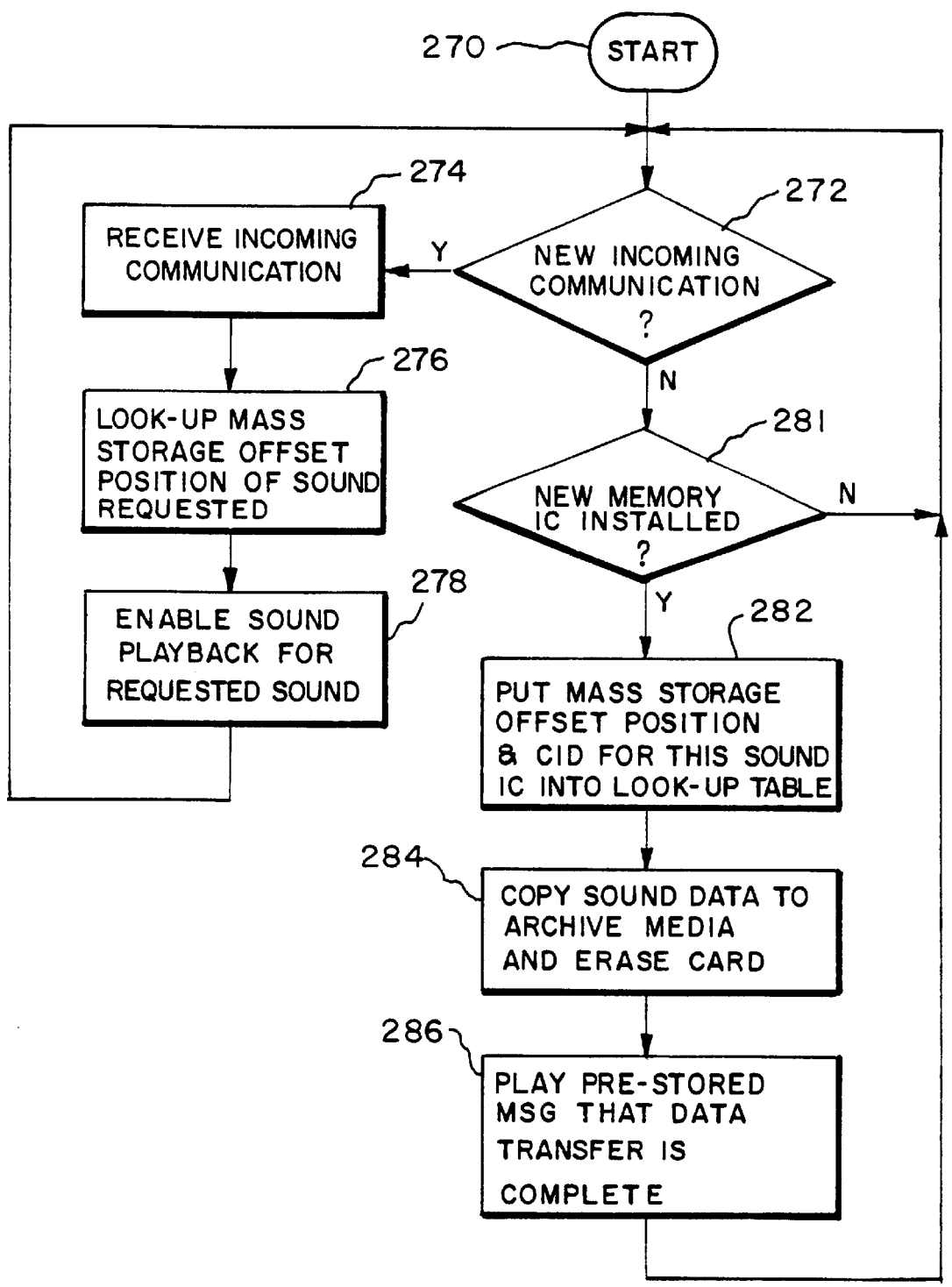
FIG. 13 is a flow chart diagram depicting the operational flow of the playback apparatus embodiment of FIG. 12.

The flow diagram of FIG. 13 illustrates the operation of the archive unit 200 of FIG. 12. Upon entering the program at 270, micro controller 220 responds to a determination at query 272 that a transmission from the wand 14 has been received to enter step sequence 274, 276, 278 to enable the playback of the sound recording identified by the picture ID number read from an icon. In this sequence, the received information is processed in step 274 by the micro-controller unit 220 to look up, in step 276, the mass storage offset position of the sound bite in the concatenated, massed association tables maintained by the micro controller unit 220 (FIG. 14). The corresponding sound data file is then retrieved, converted to an audio signal and played back, at step 278, through the sound playback module 222. If no new incoming communication is detected, step 281 checks to see if a new sound IC card 18 is connected to the data port 204 via a sound card reader and, if so, step 282 establishes a mass storage offset position for this sound data and enters it with the corresponding picture ID number into the mass look-up table. The sound IC association table is then concatenated into the look-up table. Step 284 then copies the sound data from the IC card to the mass memory medium and erases the data from the card. It will be appreciated that the sound and related data may be input from a sound card or a chip with the appropriate input device being used, i.e. a sound card reader or a data port connector. Once the data is copied and the input device is erased, step 286 indicates via audible message or visual display that the copy process is completed.

Figure 15:
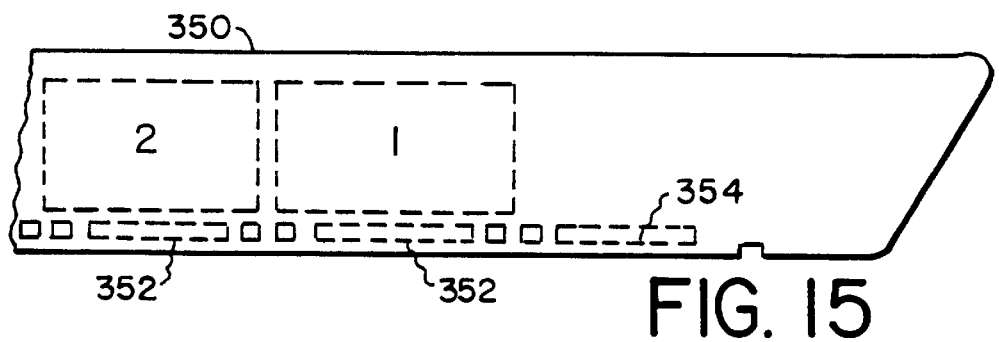
FIG. 15 is a portion of an APS photographic film strip on which identification data is magnetically recorded in a data track adjacent image frames for which sound has been recorded in association with capture of the image.

In operation, when preparing to record a sound bite with a new image, the camera writes the picture ID number (e.g.

film cartridge ID or digital image batch number, and frame number or digital image sequence number), and recording orientation ID in the next available header file site 334. Each site has an to associated sound data offset 339 which points to a predefined start site in the memory sound storage segment 340. The camera proceeds to store the recorded sound data following the start sentinel at the designated memory location. When all sound data has been recorded, the controller writes the stop sentinel to the memory at the end of the sound data to complete the data storage operation for that sound stream. This process is repeated for each of the sound tracks, if multiple microphones were employed. If the camera is of the APS type having film magnetic recording capability, then the sound card ID number from field 331 and the offset number 339 for each recording can be recorded on the magnetic layer of the APS film shown in FIG. 15. As seen in this illustration, the sound card ID number and the offset number for the sound information recording are recorded at the camera on the magnetic data tracks 352 associated with the corresponding image as the film is advanced between frames. This set of mutual pointers recorded on the film is an excellent means to ensure that the sound and image can be correctly matched up if either one of the stored pointers is damaged on the sound card or chip.

The invention has been described in detail with particular reference to certain preferred embodiments thereof, but it will be understood that variations and modifications can be effected within the spirit and scope of the invention.

PARTS LIST

| | |
|---|---|
| 10 | image print |
| 12 | sound icon |
| 14 | icon reader |
| 15 | housing |
| 16 | data port connector |
| 18 | sound IC card |
| 19 | terminals |
| 20 | communication module |
| 21 | transmitter |
| 22 | batteries |
| 24 | integrated circuit board |
| 26 | speaker/microphone enclosure |
| 28 | micro controller/sequencer |
| 30 | sound playback module |
| 31 | speaker |
| 32 | sound record module |
| 33 | microphone |
| 35 | pressure sensitive ON/OFF switch |
| 36 | data reader module |
| 38 | user interface switch |
| 40 | illumination source |
| 42 | LCD mask |
| 44 | collector lens |
| 45 | signal processor |
| 46 | light sensor |
| 48 | LCD mask segments pattern |
| 150 | icon inner data ring |
| 152 | icon outer data ring |
| 154 | icon symbol circle |
| 155 | musical note symbol |
| 156 | frame number segments |
| 158 | CID number segments |
| 160 | icon alignment mark |
| 162, 164, 166 | alignment segments |
| 200 | sound archive unit |
| 202 | icon reader cradle |
| 203 | top of sound archive unit |
| 204 | data port |
| 205 | remote communication receiver module |
| 206 | speaker |
| 207 | speaker jacks |
| 210 | text display |
| 212 | memory chip storage board |

-continued

PARTS LIST

| | |
|---|---|
| 214 | memory chips |
| 216 | expansion slots |
| 220 | micro controller unit |
| 221 | power supply |
| 222 | sound playback module |
| 280 | mass memory storage device |
| 330 | file storage architecture |
| 331 | field |
| 332 | memory header segment |
| 334 | address lines |
| 336 | sound information start sentinel |
| 337 | memory blocks |
| 338 | sound information end sentinel |
| 339 | sound bite address pointers |
| 340 | sound data storage section |
| 350 | APS film |
| 352 | magnetic data track |

What is claimed is:

1. Apparatus for reading encoded data from an icon, the icon including a plurality of data segments, the apparatus comprising:

an optical data reader module including an optical interface having dimensions corresponding to those of the icon for alignment over the icon, the module including a controller, a light sensor and plural segments, plural segments being selectively enabled to pass light therethrough, and said plural segments being individually patterned so that at least one plural segment masks each of the respective ones of said data segments when the module is aligned with the icon, wherein said controller selectively enables plural segments conforming to respective ones of said data segments and monitors the light sensor to sequentially read each of the respective ones of said data segments while the module is stationary relative to the data portion.

2. The apparatus of claim 1 and further including:

a decoder device electrically connected to the data reader module, said decoder receiving and processing the encoded data to generate picture ID data.

3. The apparatus of claim 2 and further including:

a memory module;

a data port electrically connected to the decoder device, said data port being configured to support electrical communication with the memory module to transmit the picture ID data to the memory module.

4. The apparatus of claim 3 for communication with a remote device containing the memory module and further including:

a communication device connected to the data port, said communication device transmitting the decoded picture ID data to the remote device for retrieval and playback of a sound data file corresponding to the decoded picture ID data.

5. The apparatus of claim 3 and further including:

a sound card configured for releasable engagement with the data port, the sound card defining the memory module for storing sound data files.

6. The apparatus of claim 3 wherein the data port is configured for selective engagement with a sound IC card and a communication module.

7. The apparatus of claim 6 wherein the communication module includes a transmitter for wireless communication with a remote playback device.

8. The apparatus of claim 3 and further including:

a hand held, portable housing carrying the data reader module, data decoder, and data port.

9. The apparatus of claim 8 and further including:
a sound playback unit housed in the housing and connected with said data port, the sound playback unit including a speaker, whereby a sound IC card is engaged with the data port, picture ID data is transmitted to the sound IC card, a corresponding sound data file is transmitted to the sound playback unit, and a corresponding sound bite is played via the speaker.

10. The apparatus of claim 3 wherein the memory module includes an association table linking picture ID data to sound bite locations in the memory module.

11. The apparatus of claim 1 wherein said plural segments comprise an LCD having plural segments that are selectively enabled to pass light therethrough.

12. The apparatus of claim 11 and further including:
a controller connected to the LCD, said controller sequentially enabling selected segments of the LCD and monitoring the light sensor to sequentially read portions of the data portion.

13. The apparatus of claim 11 wherein the data reader module includes an illumination source positioned on a side of the LCD nearest the icon to be read.

14. The apparatus of claim 1 for use with an icon configured such that the encoded data is arranged in annular rings circumferentially disposed about a central axis, wherein:
the data reader module includes an LCD having a circular shape and having said plural segments, wherein said plural segments are configured as circumferentially spaced, selectively transparent segments.

15. The apparatus of claim 14 wherein the annular rings of the icon comprise a plurality of dark and light segments, and the decoder is responsive to the sequence of dark and light segments sensed to determine the picture ID data.

16. The apparatus of claim 1 wherein the data reader module further comprises:
a light source for illuminating the data portion; and,
a lens interposed between the light sensor and the LCD, said lens focusing light onto the sensor, wherein said plural segments comprise an LCD having selectively light-transmissive segments and said light sensor receives light that is reflected by the data portion and passed through the light-transmissive segments of the LCD.

17. The apparatus of claim 1 wherein said data reader module includes a pressure sensitive switch positioned at a lower end thereof to actuate the apparatus for reading encoded data from the icon when the data reader module is pressed down lightly on a surface over the icon.

18. The apparatus of claim 17 wherein said LCD mask has a center and the illumination source is positioned in alignment with the center of the LCD.

19. A system for associating an image formed with a data portion comprising encoded picture identification data segments with a corresponding sound bite and for retrieving and playing the corresponding sound bite, the system comprising:
a memory module in which sound data files are stored, the memory module including an association table linking picture ID data with sound data locations;
an icon reader, including a data reader module sized for placement over the data portion, the module including a light sensor and plural segments selectively enabled to pass light therethrough, wherein at least one of said plural segments is individually patterned to mask each of the respective ones of said data segments when this module is aligned with the icon, and a circuit to selectively enable plural segments conforming to respective ones of said data segments and to monitor the light sensor to sequentially read the respective ones of said data segments of the data portion while the module is stationary relative to the data portion, the icon reader being operative to read the encoded picture ID data, the icon reader further including a data decoder connected to the data reader module, said data decoder being operative to decode the picture ID data, the icon reader further including a data port connected with the data decoder and in communication with the memory module for transmitting the picture ID data to the memory module, the memory module being responsive to receipt of the picture ID data to access the association table, determine the location of the corresponding sound bite, and retrieve the corresponding sound data file; and
a sound playback unit connected to the memory module, said sound playback unit receiving the sound data file and playing the sound data file.

20. The system of claim 19 wherein the memory module comprises a sound IC card configured for releasable engagement with the data port.

21. The system of claim 19 wherein the memory module comprises a remote unit and further including:
a communication module which may engage with the data port, said communication module being operative to communicate with the remote unit.

22. The system of claim 19 wherein the sound playback unit is housed within the icon reader.

23. The system of claim 19 wherein said plural segments comprise an LCD formed of selectively light transmissive segments.

24. The system of claim 23 wherein said data portion comprises data segments and said LCD selectively light transmissive segments are of a width narrower than a width of the data segments.

25. The system of claim 19 wherein the data portion is formed with an alignment portion, and the data reader module includes a controller programmed to sense the alignment portion to orient the data reader module with respect to the data portion.

26. The system of claim 19 wherein the data reader module is formed with an optical sensing area matching the cross-sectional area of the data portion, whereby the icon reader may be aligned with the data portion and the data portion may be read while the icon reader remains stationary.

27. The system of claim 19 wherein said icon reader includes a controller which operates to determine either if a memory module is attached to said data port or if a memory module is accessible in a remote unit and, if neither, provides an indication that no memory module is available.

28. Sound reproduction control apparatus for associating printed, encoded picture ID data from an icon with a sound data file stored in a memory module, the picture ID data uniquely associating the sound data file with a reproduced image, the icon having a configuration in which said encoded data is arranged in data segments circumferentially disposed about a central axis, the apparatus comprising:
hand held control apparatus including a data reader module, a data decoder and a data port;
the data reader module including an optical sensor having a reader area shaped to conform with said icon configuration for alignment over the icon, the data reader module including an electronically controlled mask having plural segments selectively enabled to pass light therethrough wherein at least one of said plural segments is individually patterned to mask each of the respective ones of said data segments when said module is aligned with the icon; and said plural segments having a circuit to selectively enable said plural segments that conform to respective ones of said data segments and to monitor the light sensor to sequentially read the respective ones of said data segments while the module is stationary relative to the icon, the data decoder being operative to decode said encoded data from the data reader module to determine picture ID data; and the data port being adapted to receive a data transfer device, said data transfer device accessing said memory module having said sound data file stored therein at a memory location identified by an association table.

29. Apparatus according to claim 28, wherein said memory module comprises a detachable digital memory IC card and said hand held control apparatus includes a sound playback apparatus, said sound playback apparatus reproducing audible sound from the sound data file accessed from said memory module on the sound IC card.

30. Apparatus according to claim 28 wherein said hand held apparatus includes a sound recording apparatus recording sound as digital data in said memory module at a selected memory location.

31. Apparatus according to claim 28 for use with a remote sound playback apparatus having said memory module included therein and further including a wireless data communication module releasably connectable with the data port, said wireless data communication module communicating said picture ID data to said remote apparatus for accessing an associated sound data file in said memory module as determined by reference to an association table stored in the memory module.

32. Apparatus according to claim 31, wherein said memory module in said remote apparatus comprises mass memory capable of storing digital sound data therein and said remote apparatus includes sound playback means for playing back sound data stored in said mass memory.

* * * * *